(12) United States Patent
Kudo et al.

(10) Patent No.: US 7,932,185 B2
(45) Date of Patent: Apr. 26, 2011

(54) PROCESS FOR FABRICATING SEMICONDUCTOR DEVICE

(75) Inventors: Toshio Kudo, Tokyo (JP); Bunji Mizuno, Ikoma (JP); Yuichiro Sasaki, Machida (JP); Cheng-Guo Jin, Kanagawa (JP)

(73) Assignees: Sumitomo Heavy Industries, Ltd., Tokyo (JP); Panasonic Corporation, Osaka (JP)

( * ) Notice: Subject to any disclaimer, the term of this patent is extended or adjusted under 35 U.S.C. 154(b) by 760 days.

(21) Appl. No.: 11/292,072

(22) Filed: Dec. 2, 2005

(65) Prior Publication Data

US 2006/0183350 A1    Aug. 17, 2006

Related U.S. Application Data

(63) Continuation of application No. PCT/JP2004/007606, filed on Jun. 2, 2004.

(30) Foreign Application Priority Data

Jun. 2, 2003  (JP) ................................. 2003-156769

(51) Int. Cl.
*H01L 21/31*    (2006.01)
*H01L 21/00*    (2006.01)
(52) U.S. Cl. ................. 438/758; 438/795; 257/E21.347
(58) Field of Classification Search .................. 438/795, 438/758; 257/E21.347
See application file for complete search history.

(56) References Cited

U.S. PATENT DOCUMENTS

| | | | | | |
|---|---|---|---|---|---|
| 4,370,510 | A | * | 1/1983 | Stirn | 136/262 |
| 4,620,785 | A | * | 11/1986 | Suzuki et al. | 355/53 |
| 4,655,601 | A | * | 4/1987 | Suzuki | 356/401 |
| 4,694,138 | A | * | 9/1987 | Oodaira et al. | 219/121.85 |
| 5,571,430 | A | * | 11/1996 | Kawasaki et al. | 219/121.78 |
| 5,688,715 | A | * | 11/1997 | Sexton et al. | 438/75 |
| 5,908,307 | A | * | 6/1999 | Talwar et al. | 438/199 |
| 5,948,287 | A | * | 9/1999 | Bandelin et al. | 219/121.64 |
| 6,297,115 | B1 | | 10/2001 | Yu | |
| 6,472,302 | B1 | * | 10/2002 | Lee | 438/597 |
| 6,475,888 | B1 | | 11/2002 | Sohn | |
| 6,528,397 | B1 | | 3/2003 | Taketomi et al. | |
| 6,566,683 | B1 | * | 5/2003 | Ogawa et al. | 257/53 |

(Continued)

FOREIGN PATENT DOCUMENTS

EP    1049144 A1    11/2000

(Continued)

OTHER PUBLICATIONS

Murto et al, "An Investigation of Species Dependence in Germanium Pre-amorphized and Laser Thermal Annealed Ultra-Shallow Abrupt Junctions," 2000 International Conference on Ion Implantation Technology Proceedings, IEEE, Sep. 17-22, 2000, pp. 182-185.

(Continued)

*Primary Examiner* — Walter L Lindsay, Jr.
*Assistant Examiner* — Ron Pompey
(74) *Attorney, Agent, or Firm* — Squire, Sanders & Dempsey (US) LLP

(57) ABSTRACT

A laser annealing process capable of suppressing a variation in sheet resistance. A surface layer formed shallower than 100 nm in a substrate of semiconductor material is added with impurities. The substrate is irradiated with a laser beam or its harmonic beam emitted from a laser diode pumped to solid-state laser to activate the impurities.

14 Claims, 12 Drawing Sheets

U.S. PATENT DOCUMENTS

| | | | |
|---|---|---|---|
| 6,632,729 B1 * | 10/2003 | Paton | 438/535 |
| 6,635,588 B1 * | 10/2003 | Hawryluk et al. | 438/795 |
| 6,642,122 B1 * | 11/2003 | Yu | 438/372 |
| 6,767,773 B2 | 7/2004 | Sano et al. | |
| 7,432,146 B2 * | 10/2008 | Yamamoto | 438/197 |
| 2002/0086502 A1 | 7/2002 | Liu et al. | |
| 2002/0121654 A1 | 9/2002 | Yamamoto | |
| 2002/0175372 A1 | 11/2002 | Takizawa | |
| 2003/0040130 A1 * | 2/2003 | Mayur et al. | 438/14 |
| 2005/0224799 A1 * | 10/2005 | Yamamoto et al. | 257/66 |

FOREIGN PATENT DOCUMENTS

| | | | |
|---|---|---|---|
| JP | 62104154 A * | 5/1987 | |
| JP | 6322453 B2 | 5/1988 | |
| JP | 01187814 A * | 7/1989 | |
| JP | 11-330463 | 11/1999 | |
| JP | 11354463 A | 12/1999 | |
| JP | 2000260728 A | 9/2000 | |
| JP | 2000349039 A | 12/2000 | |
| JP | 2001-509316 | 7/2001 | |
| JP | 2002-175772 | 6/2002 | |
| JP | 2002-246601 | 8/2002 | |
| JP | 2002-524846 | 8/2002 | |
| JP | 2002-270505 | 9/2002 | |
| JP | 2002-280548 | 9/2002 | |
| JP | 2002261015 A | 9/2002 | |
| JP | 2002299346 A | 10/2002 | |
| JP | 2002343734 A | 11/2002 | |
| JP | 2003151906 A | 5/2003 | |
| WO | WO 98/33206 | 7/1998 | |
| WO | WO 98/34268 | 8/1998 | |
| WO | WO 00/13213 | 3/2000 | |
| WO | WO 00/60655 | 10/2000 | |
| WO | WO 01/80300 A1 | 10/2001 | |

OTHER PUBLICATIONS

Murto et al, "Activation and Deactivation Studies of Laser Thermal Annealed Boron, Arsenic, Phosphorus, and Antimony Ultra-Shallow Abrupt Junctions," 2000 International Conference on Ion Implantation Technology Proceedings, IEEE, Sep. 17-22, 2000, pp. 155-158.

Goto et al, "Ultra-Low Contact Resistance for Deca-nm MOSFETs by Laser Annealing," IEDM Tech. Digest, 1999, pp. 931-933.

Yu et al, "70nm MOSFET with Ultra-Shallow, Abrupt, and Super-Doped S/D Extension Implemented by Laser Thermal Process (LTP)," IEDM Tech. Digest, 1999, p. 509.

Yamamoto et al, "Drive Current Enhancement by Ideal Junction Profile Using Laser Thermal Process," Symposium on VLSI Technology Digest of Technical Papers, 2002, pp. 138-139.

Talwar et al, "Laser Thermal Processing (LTP) for Fabrication of Ultrashallow, Hyper-Abrupt, Highly Activated Junctions for Deca-Nanometer MOS Transistors," Electrochemical Society Proceedings, Sep. 2000, pp. 95-105.

Park et al, "50 nm SOI CMOS Transistors with Ultra Shallow Junction Using Laser Annealing and Pre-Amorphization Implantation," Symposium on VLSI Technology Digest of Technical Papers, 2001, pp. 69-70.

Yamamoto et al, "Impact of Pre-Amorphization for the Reduction of Contact Resistance Using Laser Thermal Process," Extended Abstracts of International Workshop on Junction Technology, 2002, pp. 27-30.

Kagawa et al, "Influence of Pulse Duration on KrF Excimer Laser Annealing Process for Ultra Shallow Junction Formation," Extended Abstracts of International Workshop on Junction Technology, 2002, pp. 31-34.

Kurobe et al, "Formation of Low-Resistive Ultra-Shallow $n^+/p$ Junction by Heat-Assisted Excimer Laser Annealing," Extended Abstracts of International Workshop on Junction Technology, 2002, pp. 35-36.

Takashi Nire, "Ultra Shallow Junction Formation by Laser Anneal," The Japan Society of Applied Physics, Silicon Technology Division, No. 39, 2002, pp. 23.-26.

European Search Report, PCT/JP2004007606, dated Apr. 23, 2008.

Japanese Office Action, Japanese Patent Application No. 2003-156769, Date of Completion: Apr. 19, 2010, Date Mailed: Apr. 27, 2010, pp. 1-3.

* cited by examiner

Fig. 9
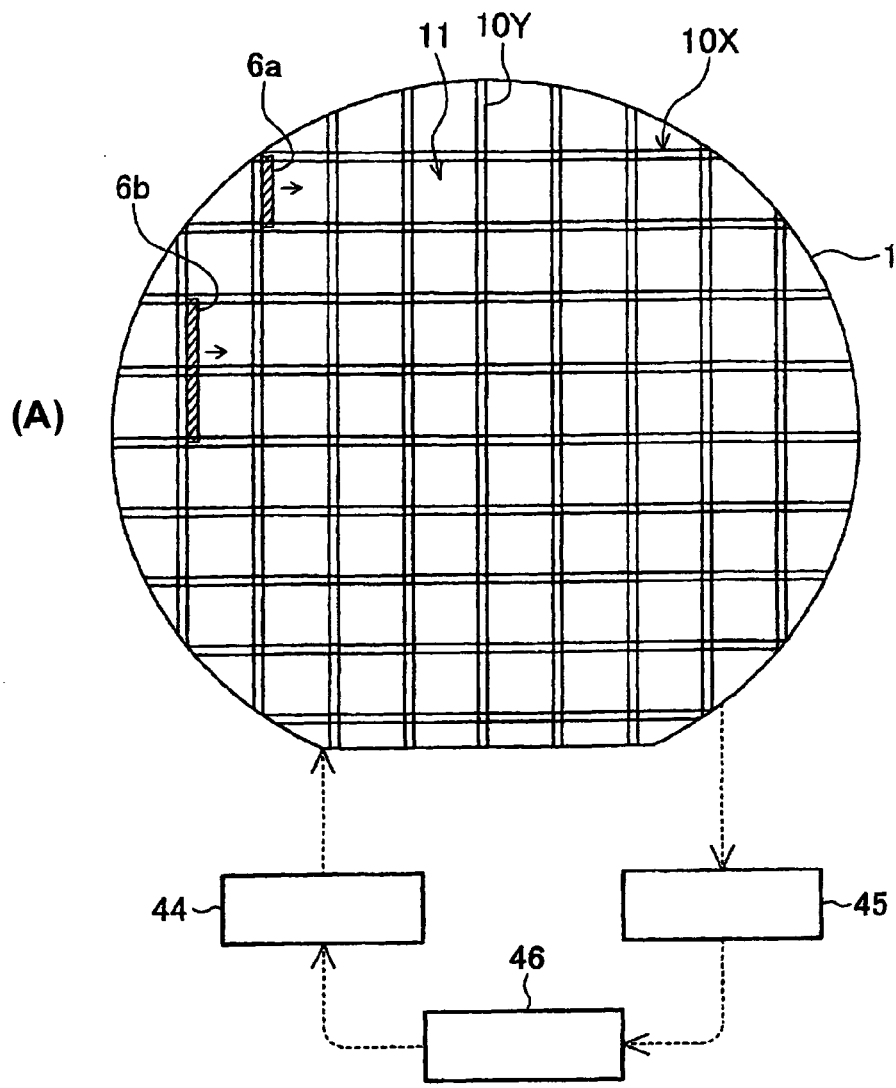
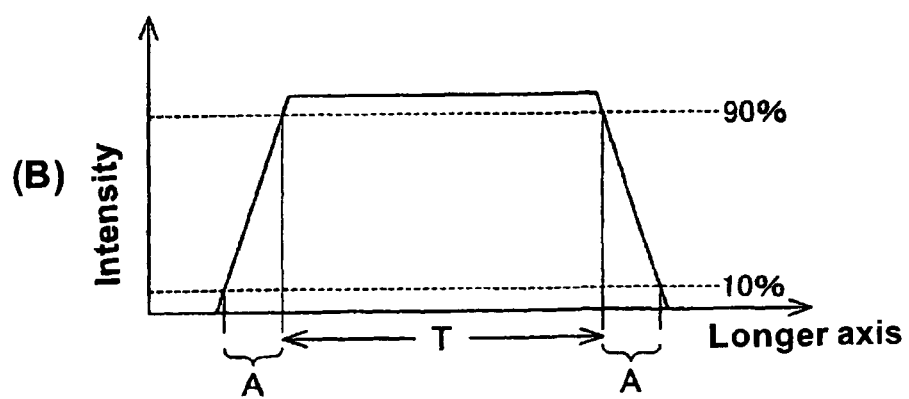

PROCESS FOR FABRICATING SEMICONDUCTOR DEVICE

TECHNICAL FIELD

The present invention relates to a process for producing semiconductor devices and, more particularly, to a process for producing semiconductor devices having a step of activating, by irradiation with a laser beam, impurities contained in a wafer made of a semiconductor material.

Arts have been sought for which would enable formation of ultra-shallow pn junction exhibiting reduced resistance and improved short-channel effect, in order to cope with demand for mass-production of MOSFETs having gate lengths not greater than 50 nm. As a measure for implementing such arts, technical innovations have been expected with regard to methods for introducing impurities into a semiconductor material, especially silicon, and also to methods for electrically activating the introduced impurities.

A major technique for activating impurities currently adopted in mass production is a method referred to as Rapid Thermal Annealing (RTA). In RTA, diffusion of impurity atoms and activation rate are in trade-off relation to each other. That is, suppression of impurity diffusion for achieving shallower junction makes it difficult to attain higher activation rate. Conversely, attempts to enhance activation rate promotes impurity diffusion to undesirably increase the depth of junction. For these reasons, it has been found that mass-production of MOSFETs having gate lengths of 50 nm or smaller and exhibiting satisfactory performance is not easy, when RTA is relied upon.

Laser annealing is noted as a method for enhancing activation rate while suppressing diffusion of impurities.

Later-mentioned patent documents 1 and 2 disclose methods for annealing silicon wafers dopes with impurities by using excimer laser. Annealing methods using excimer laser are also reported in, for example, "IEDM Tech. Digest, p931 (1999)", "IEDM Tech. Digest, p509(1999)", "Symp. on VLSI Tech, p138 (2002)", "Electrochem. Soc. Symp. Proc. 2000-9, 95(2000)", "Symp. VLSI Tech. Digest, p69 (2001)", "Extended Abstracts of International Workshop on Junction Technology 2002. p27-30", "Extended Abstracts of International Workshop on Junction Technology 2002. p31-34", "Extended Abstracts of International Workshop on Junction Technology 2002. p35-36", and "Study Group on Silicon Technology, The Japan Society of Applied Physics, No. 39, p23 (2002)".

The "Study Group on Silicon Technology, The Japan Society of Applied Physics, No. 39, p23 (2002)" teaches that, the energy of excimer laser, when applied to silicon, is absorbed in quite a short time of about 10 ns in a very surface region of about 10 nm thick, because excimer laser is ultraviolet pulse laser, making it possible to suppress diffusion of impurities and, therefore, to form an ultra-shallow pn junction.

A description will now be given of the laser annealing method disclosed in the "Extended Abstracts of International Workshop on Junction Technology 2002. p31-34".

An n-type silicon wafer having principal plane constituted by ("100") crystalline plane is doped with boron ions with acceleration energy of 0.5 keV and at a dosage of $5 \times 10^{14}$ $cm^{-2}$. Doping with germanium ions also is conducted with acceleration energy of 5 keV and at a dosage of $5 \times 10^{15}$ $cm^{-2}$. A surficial region of the silicon wafer is non-crystallized to become amorphous as a result of the ion implantation. The thickness of the amorphous layer thus formed is about 12 nm.

The silicon wafer is then irradiated with a single shot of excimer laser of 248 nm wavelength. The pulse width of the excimer laser is selected from among 10 ns, 33 ns, 38 ns, 55 ns, and 62 ns. The pulse energy density on the silicon wafer surface is selected to fall in a range of from 400 mJ/cm² to 921 mJ/cm². After the irradiation with the laser, the impurity distribution in the surficial region of the specimen is evaluated by secondary ion mass spectrometry (SIMS), followed by measurement of the sheet resistance.

Depths of the pn junction not greater than 30 nm and sheet resistance values of 1000 Ω/□ or less are simultaneously attained under one of the following combinations of the pulse width and the pulse energy density: 10 ns at 500 mJ/cm²; 10 ns at 600 mJ/cm²; 33 ns at 700 mJ/cm²; 38 ns at 700 mJ/cm²;; 38 ns at 800 mJ/cm²; 55 ns at 800 mJ/cm²; and 55 ns at 900 mJ/cm². The depth of the junction is defined as the depth at which the boron concentration is $1 \times 10^{18}$ $cm^{-3}$.

FIG. 10 shows the depthwise distribution of boron concentration in the specimens annealed with the excimer laser having pulse width of 38 ns. The boron concentration distribution was measured by SIMS. The axis of abscissa represents the depth expressed by "nm", while the axis of ordinate shows the boron concentration at a unit of "$cm^{-3}$". Numerical values attached to the curves indicate the pulse energy densities of the annealing pulse lasers at the surfaces of the specimens.

It is understood that the depth of the junction in terms of the depth at which the boron concentration is $1 \times 10^{18}$ $cm^{-3}$ is about 17 nm, when the pulse energy density is 700 mJ/cm². The sheet resistance is about 450 Ω/□. Junction depth of about 26 nm and sheet resistance of about 400 Ω/□ are simultaneously obtained when the pulse energy density is 800 mJ/cm².

Junction depth obtained at pulse energy density of 500 mJ/cm² is almost equivalent to that obtained without any laser annealing. The disclosure is silent with the sheet resistance. It is presumed that activation of boron has not occurred substantially under this condition.

A description will now be given of a laser annealing technique which is disclosed in the later-mentioned Patent Document 3. This document discloses an invention in which impurity concentration in the gate electrode of MOSFET is decreased towards a gate insulation film. The disclosure includes a step in which an impurity in the gate electrode is activated by annealing with a laser.

The process disclosed in the above-mentioned document begins with deposition of a gate insulation film on the surface of a silicon wafer, on which are deposited a boron-doped SiGe layer and a non-doped Si layer by sputtering. Then, injection of boron ions is performed with acceleration energy of 7 keV and at a dosage of $4 \times 10^{15}$ $cm^{-2}$. Then, a single shot of excimer laser is applied at an irradiation energy density of 500 mJ/cm² in a 2-chip bulk shot mode. Alternatively, two shots of laser irradiation may be performed at an irradiation energy density of 500 mJ/cm². The SiGe layer is crystallized as a result of the laser annealing, thereby reducing the resistance.

The disclosure includes a description which states that excimer laser beam or a solid-state laser beam may be used as the ultraviolet pulse beam employed in the laser annealing. The wavelength of the fundamental wave of ordinary solid-state laser, e.g., Nd:YAG, is about 1000 nm. The solid-state laser beam mentioned in the disclosure is understood to mean the third or higher harmonics of the fundamental wave.

Considering that the boron ion injection is conducted with acceleration energy of 7 keV, it is understood that the depth at which the boron concentration reaches $1 \times 10^{18}$ $cm^{-3}$ is not smaller than 100 nm. Clearly, no art is disclosed for forming any ultra-shallow junction of 100 nm or shallower.

Later-mentioned Non-Patent Documents 1 and 2 disclose laser annealing methods which employ a laser beam of 532 nm wavelength.

FIG. 11 shows the relationship between junction depths and pulse energy densities as disclosed in the Non-Patent Documents 1 and 2. The abscissa shows the pulse energy density by a unit of "mJ/cm$^2$", while the ordinate represents the junction depth by a unit of "nm". The junction depth is maintained at about 26 nm when the pulse energy density ranges from 350 mJ/cm$^2$ to 460 mJ/cm$^2$. It is understood that variation of junction depth is small when the pulse energy density falls within the above-mentioned range.

Patent Document 1: Japanese Translation Publication (of PCT International Application) No. 2001-509316
Patent Document 2: Japanese Translation Publication (of PCT International Application) No. 2002-524846
Patent Document 3: Japanese Unexamined Patent Application Publication No. H11-330463
Non-Patent Document 1: R. Murto et al., An Investigation of Species Dependence in Germanium Pre-amorphized and Laser Thermal Annealed Ultra-Shallow Abrupt Junctions, "2000 International Conference on Ion Implantation Technology Proceedings", (US) IEEE, Sep. 17-22, 2000, p182-185
Non-Patent Document 2: R. Murto et al., Activation and Deactivation Studies of laser Thermal Annealed Boron, Arsenic, Phosphorous, and Antimony Ultra-Shallow Abrupt Junctions, "2000 International Conference on Ion Implantation Technology Proceedings", (US) IEEE, Sep. 17-22, 2000, p155-158

DISCLOSURE OF INVENTION

FIG. 12 shows the relationship between the sheet resistance and the pulse energy density as disclosed in the Non-Patent Documents 1 and 2. The abscissa shows the pulse energy density at a unit of "mJ/cm$^2$", while the ordinate shows the sheet resistance at a unit of $\Omega/\square$. Representing the sheet resistance by Rs ($\Omega/\square$) and the pulse energy density by E (mJ/cm$^2$), the graph shown in FIG. 12 is approximated by the following equation:
(Equation 1)

$$Rs = 0.0938 \times E^2 - 89 \times E + 21258 \qquad (1)$$

According to the Equation (1), the sheet resistance varies by about 10.2% when the pulse energy density fluctuates by 1% around the base density of 430 mJ/cm$^2$. The above-mentioned documents shows that the energy stability of the pulse laser oscillator of 532 nm wavelength is ±3%. Pulse energy density fluctuation of ±3% causes a sheet resistance variation of ±30.6%. This large variation of the sheet resistance makes it difficult to adopt the disclosed laser annealing method in an industrial mass-production process.

An object of the present invention is to provide a laser annealing method which makes it possible to suppress sheet resistance variation.

According to one aspect of the present invention, a process is provided for producing a semiconductor device, the process having the steps of (a) adding an impurity into a surficial region of a depth of 100 nm or less of a wafer made of a semiconductor material; and (b) irradiating the wafer with a laser beam emitted from a laser-diode-pumped solid-state laser or with a higher harmonic of the laser beam, thereby activating the impurity.

The use of the laser-diode-pumped solid-state laser enhances the energy stability, thereby reducing fluctuation of the annealing condition, whereby the variation in the sheet resistance is suppressed.

BRIEF DESCRIPTION OF THE DRAWINGS

FIG. 9A includes a plan view illustrating a positional relationship between a semiconductor wafer annealed by a method embodying the present invention and a position at which a laser beam impinges upon the wafer, and a block diagram of a position control apparatus for controlling the position of a beam incident region relative to the semiconductor wafer, while
FIG. 9B is a graph showing beam intensity distribution along the length of a beam cross-section.

THE BEST MODE FOR CARRYING OUT THE INVENTION

Figure 1:
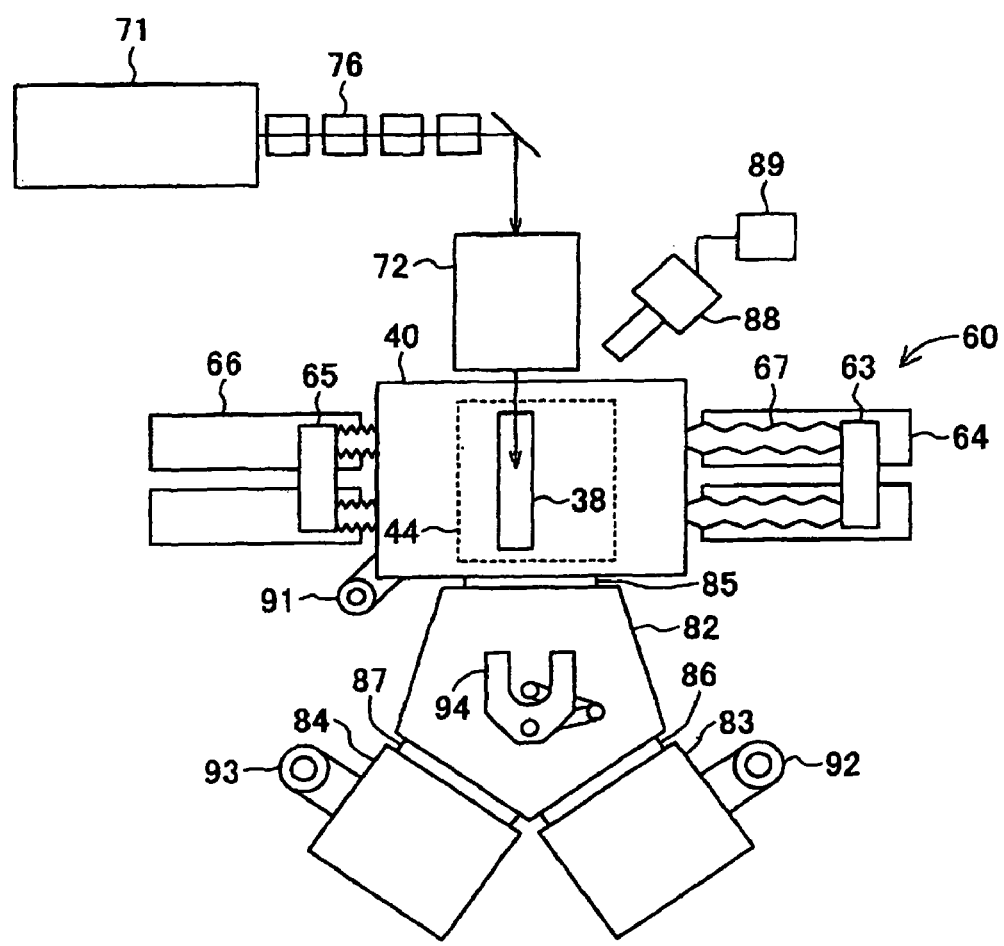
FIG. 1 is a schematic illustration of a laser annealing apparatus employed in an embodiment of the present invention.

FIG. 1 is a schematic illustration of a laser annealing apparatus employed in one embodiment of the present invention. The laser annealing apparatus includes the following parts or components: a processing chamber 40; a transfer chamber 82; outlet/inlet chambers 83, 84; a laser light source 71; a homogenizer 72; a CCD camera 88; and a video monitor 89. A linear motion mechanism 60 attached to the processing chamber 40 includes a bellows 67, coupling members 63, 65, a linear guide mechanism 64, a linear motor 66, and so forth. The linear motion mechanism 60 is arranged to cause a translational movement of the stage 44 disposed in the processing chamber 60.

The processing chamber 40 and the transfer chamber 82 are coupled to each other through a gate valve 85. The transfer chamber 82 is connected to the outlet/inlet chamber 83 and to the outlet/inlet chamber 84, through gate valves 86 and 87, respectively. The processing chamber 40, the outlet/inlet chamber 83 and the outlet/inlet chamber 84 are equipped with vacuum pumps 91, 92 and 93, respectively, so as to be evacuated by these vacuum pumps.

The transfer chamber 82 accommodates a transfer robot 94. The transfer robot 94 transfers wafers as the processing objects from the processing chamber 40 to the outlet/inlet chambers 83, 84 and vice versa.

A quartz window 38 transmissive to the laser beam I provided in a top wall of the processing chamber 40. A visible optical glass such as BK7 may be used instead of quartz. A pulse laser beam emitted from the laser light source 71 runs into the homogenizer through an attenuator 76. The homogenizer 72 serves to create an elongated cross-sectional shape of the laser beam, while uniformalizing the beam intensity along the longer and shorter axes. In other words, the homogenizer 72 functions to provide a top-flat shape of the beam intensity distribution. The laser beam transmitted through the homogenizer 72 then runs through the quartz window 38 which also has an elongated shape corresponding to the cross-sectional shape of the laser beam. The laser beam then impinges upon a wafer as the processing object held on the stage 44 inside the processing chamber 40. The relative positions of the homogenizer 72 and the wafer to each other are adjusted such that the surface of the wafer is aligned with the surface of the homogenizer.

The direction of the translational movement of the stage 55 caused by the linear motion mechanism 60 is perpendicular to the direction of the longer axis of the quartz window 38, so that a wide area of the wafer can be irradiated with the laser beam. An image of the wafer surface is taken by a CCD camera 88, so that the wafer surface under processing can be monitored through the video monitor 89.

The laser light source 71 includes a solid-state laser which employs a semiconductor laser diode as the pumping light source, and a wavelength conversion element. The laser medium of the solid-state laser may be, for example, Nd:YLF, Nd:YAG, Nd:YVO$_4$, or Cr:Nd:GSGG. The pulse laser beam emitted from the laser light source 71 is the second harmonic of the fundamental wave oscillated by the laser medium.

A description will now be give of a laser annealing method employed in an embodiment of the present invention. Argon ions (Ar) are implanted in a surficial region of an n-type silicon wafer 1 which has a principal plane coinciding with (100) plane, with acceleration energy of 6 keV and at a dosage of $1 \times 10^{14}$ cm$^{-2}$, so that the surficial region of the silicon wafer 1 is non-crystallized to provide an amorphous layer of about 20 nm thick.

Then, boron ions are injected into the surficial region of the silicon wafer 1 by plasma doping. The plasma doping is conducted at a bias voltage of −100V, by using plasma of a gaseous mixture formed by diluting B$_2$H$_6$ gas with He gas. The boron dosage was $4 \times 10^{14}$ cm$^{-2}$ and the depth at which the concentration of $1 \times 10^{18}$ cm$^{-3}$ was attained ranged between 8 and 10 nm.

The boron-doped silicon wafer is held on the stage 44 of the laser annealing apparatus shown in FIG. 1, and a laser beam is made to be incident to the surface of the wafer. The incident laser beam is the second harmonic of Nd:YLF laser, having a wavelength of 527 nm, pulse width of 110 ns, and a pulse frequency of 1 KHz. The wafer was moved in a direction perpendicular to the longer axis of the beam cross-section, in such a manner that the overlap ratio of the beam cross-section on the wafer surface is 50%.

The definition of the term "overlap ratio" used in this specification is defined as follows. The width T of a region in the beam cross-section on the wafer surface, which exhibits intensity levels not lower than 90% of the maximum intensity throughout the beam cross-section, is referred to as a "top-flat width". At the same time, the pitch or travel of the beam, i.e., the distance between the region irradiated with one single shot of the laser beam and the region irradiated by the next single shot of the laser beam, is referred to as a "beam-step width".

Then, the overlap ratio is defined as follows:

$$(T-S)/T \times 100[\%]$$

The pulse energy density on the surface of the silicon wafer was varied within the range of from 300 mJ/cm$^2$ and 3900 mJ/cm$^2$. A nitrogen gas atmosphere was maintained inside the processing chamber 40. An inert gas other than nitrogen, e.g., argon gas or helium gas, may be used as the atmosphere gas instead of the nitrogen gas.

The intensity distribution of the beam cross-section on the wafer surface in the direction perpendicular to the longer axis exhibits a top-flat ratio of about 50%. The term "top-flat ratio" is defined as the value which is obtained by dividing the aforementioned top flat width T by the half-value width of the intensity distribution along the shorter axis of the beam cross-section on the wafer surface. In order to achieve uniform annealing, it is preferred that the top-flat ratio is 50% or greater.

Preferably, the silicon wafer is subjected to a dehydrogenation prior to the laser annealing. Such dehydrogenation may be effected by application of a laser beam onto the wafer surface, heating of the wafer, or by irradiation with an electromagnetic wave. Dehydrogenation effectively suppresses roughening of the wafer surface. The laser beam, when applied for the purpose of dehydrogenation, may be a laser beam having the same wavelength as that of the beam used in the subsequent activation annealing, but the pulse energy density is set to fall within the range of from 500 mJ/cm$^2$ and 1300 mJ/cm$^2$. A pulse energy density within this range causes desorption of hydrogen without allowing melting of surficial region of the silicon wafer.

Figure 2:
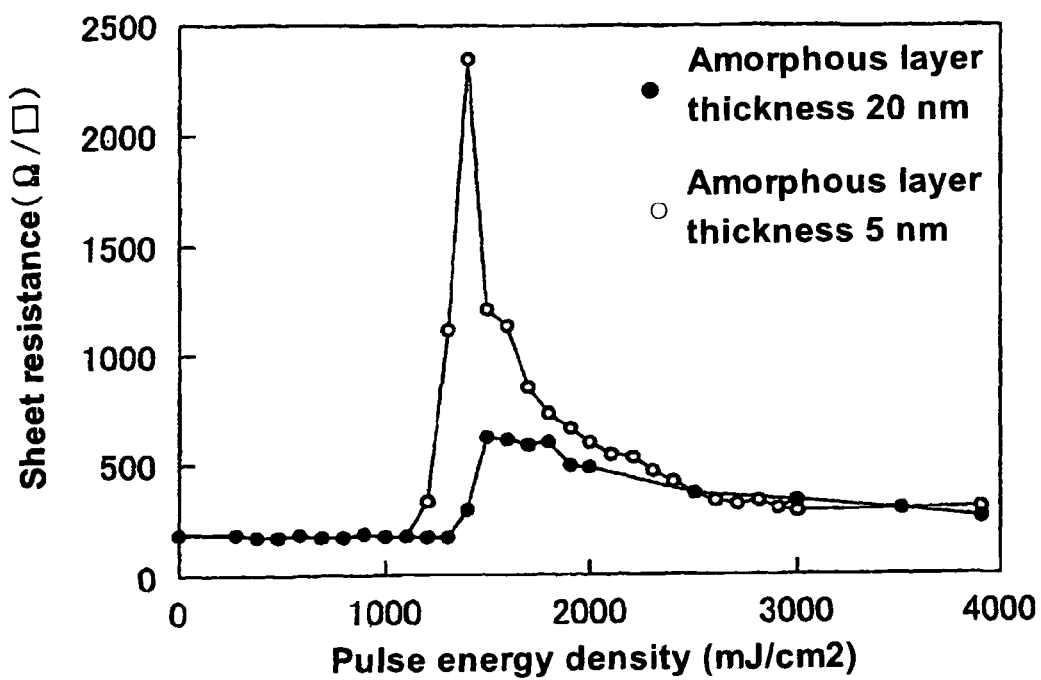
FIG. 2 is a graph showing the relationship between sheet resistance and pulse energy density of a laser beam used in the laser annealing.

FIG. 2 shows the relationship between the pulse energy density on the silicon wafer surface and the sheet resistance. The axis of abscissa represents the pulse energy density at a unit of "mJ/cm$^2$", while the axis of ordinate shows the sheet resistance at a unit of "Ω/□". In FIG. 2, the solid black circles or dots show the values of the sheet resistance exhibited by specimen sheets produced in accordance with the above-described method embodying the present invention. The white circles show the values of sheet resistance exhibited by specimen sheets which were prepared by setting the thickness of the amorphous layer to 5 nm prior to the plasma doping. Such amorphous layer was formed by irradiation with argon plasma.

When the thickness of the amorphous layers was set to 20 nm as in the described embodiment, the sheet resistance values obtained under a pulse energy density of less than 1300 mJ/cm$^2$ were almost equivalent to those observed prior to laser annealing, i.e., resistance values ranged from 170 to 180 Ω/□. This suggests that boron is not substantially activated when the pulse energy density is 1300 mJ/cm$^2$ or below.

The sheet resistance was increased from 180 Ω/□ to 600 Ω/□ in accordance with an increase of the pulse energy density from 1300 mJ/cm$^2$ to 1500 mJ/cm$^2$. It is understood that the pulse energy density falling within this range causes melting of the surficial region of the silicon wafer to allow activation of boron, but the concentration of the activated boron is not raised to a level high enough to compensate for the n-type impurity with which the silicon wafer has been doped, so that the sheet resistance values of the n-type region are observed. It is considered that the injected boron can be activated when the pulse energy density at the wafer surface is increased beyond 1300 mJ/cm². In order to activate the boron, the pulse energy density is preferably set to a level which is high enough to raise the temperature of the surfacial region of the silicon wafer to a level not lower than the melting point of the material of the surfacial region.

A decrease of the sheet resistance from 600 Ω/□ to 240 Ω/□ was observed in accordance with an increase of the pulse energy density in the range of 1500 mJ/cm² or above. It is considered that the increase of the pulse energy density in this range promoted activation of boron to allow formation of a p-type layer in the surfacial region of the silicon wafer, and the sheet resistance of the p-type layer decreased in accordance with the increase of the pulse energy density.

When the amorphous layer thickness was set to 5 nm, the sheet resistance once increases to a peak value and then decreases in accordance with the increase of the pulse energy density, similarly to the sheet resistance in the described embodiment. In this case, however, the absolute value of the sheet resistance is much greater than that observed in the described embodiment.

Figure 3:
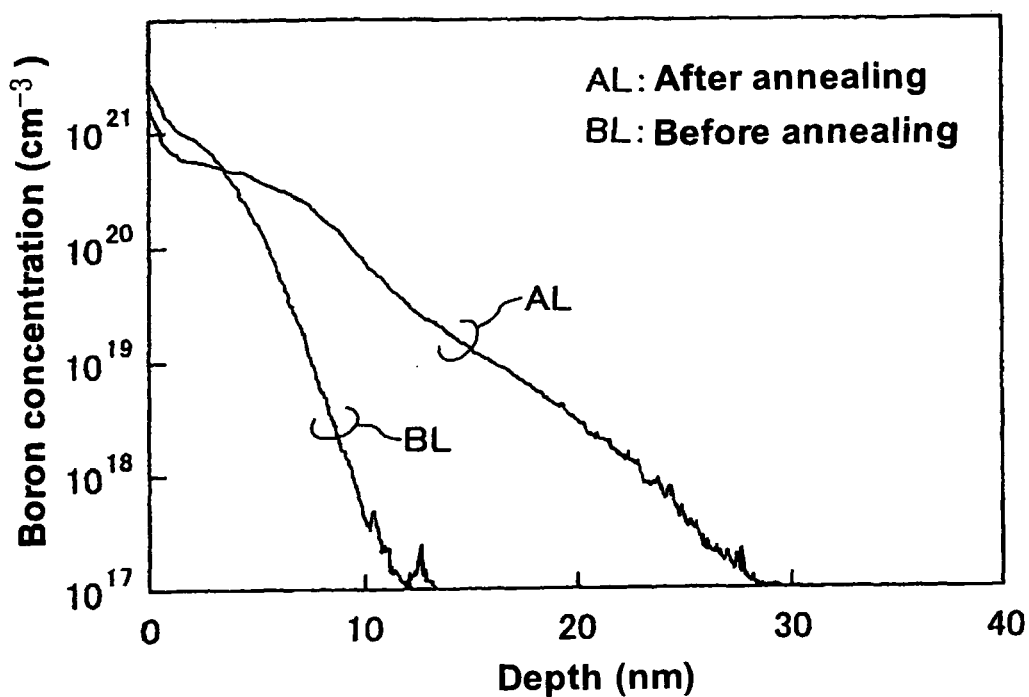
FIG. 3 is a graph showing depthwise boron concentration distribution as observed before and after a laser annealing.

FIG. 3 shows depthwise boron concentration distribution of specimens which were produced in accordance with the described embodiment under the pulse energy density of 1500 mJ/cm². The axis of abscissa indicates the depth at a unit of "nm", while the axis of ordinate represents the boron concentration at a unit of "cm⁻³". The boron concentration was measured by SIMS. The dot group AL shows the boron concentrations as observed after the laser annealing, while the boron concentration observed prior to the laser annealing is shown by the dot group BL.

Defining the junction depth as the depth where the boron concentration of $1 \times 10^{18}$ cm$^{-3}$ is obtained, the junction depth after the laser annealing is about 23 nm.

Future demand will require MOSFETs having drain extension portions having junction depths of about 13 nm to 22 nm and exhibiting sheet resistance values of 770 Ω/□ or smaller. The junction depth of about 23 nm and sheet resistance of 600 Ω/□ (see FIG. 2) are simultaneously achieved when the pulse energy density is set to 1500 mJ/cm², thus substantially fulfilling the requirements for the junction depth of the extension portion and the sheet resistance.

As will be seen from the foregoing, in accordance with the described method embodying the present invention, it is possible to form an impurity diffusion region having a junction depth of 30 nm or smaller. In addition, the method of the described embodiment makes it possible to form junctions of depths not greater than 100 nm with high reproducibility, over the known RTA process with which formation of shallow junctions of 100 nm or less was difficult.

Amorphous silicon has a melting point lower than that of single-crystal silicon. By melting the amorphous layer at a comparatively low temperature, it is possible to restrain the temperature rise of the single-crystal region underlying the amorphous layer. Depthwise diffusion of impurity can be suppressed when the single-crystal region is maintained at comparatively low temperatures.

Figure 4:
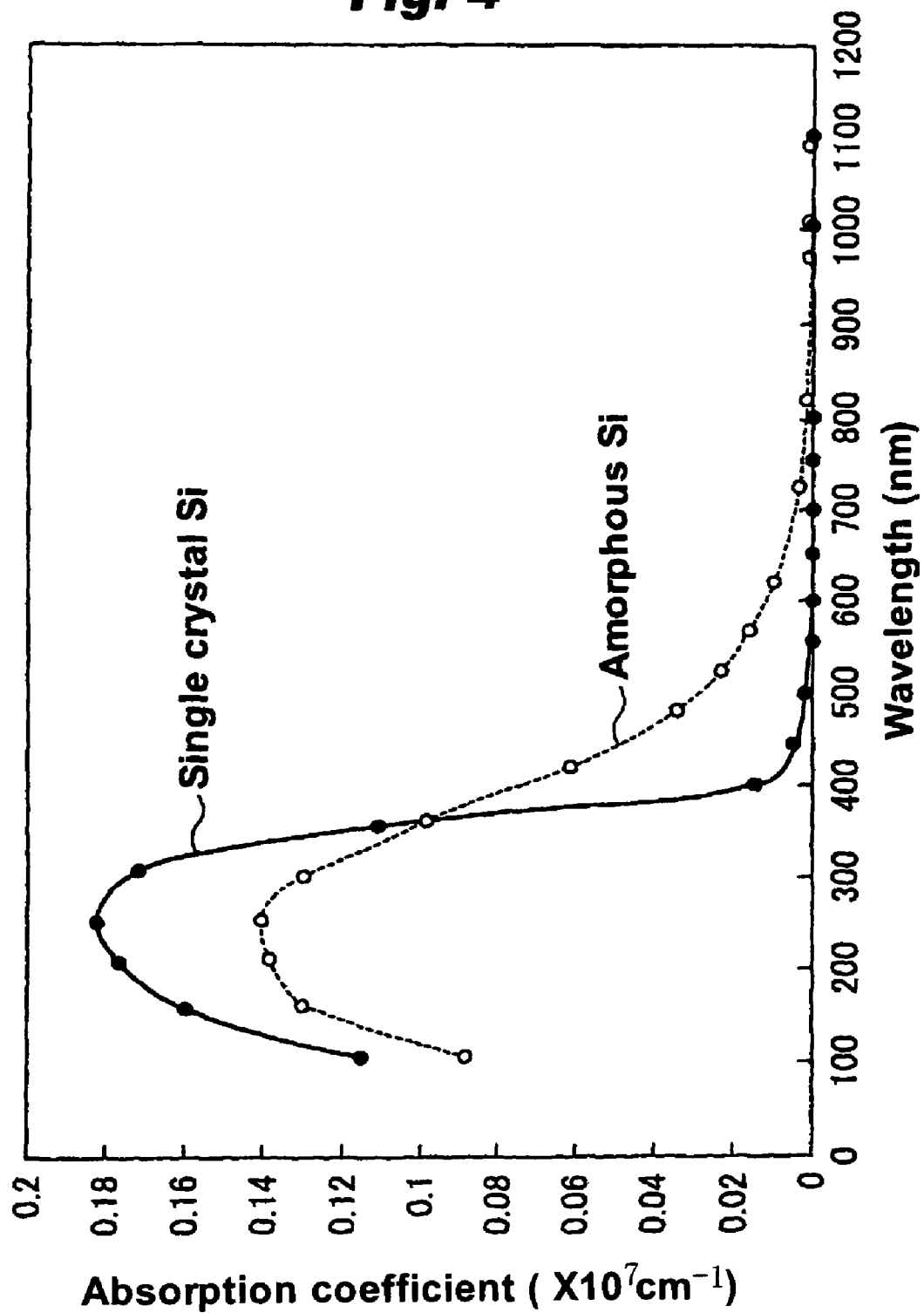
FIG. 4 is a graph showing wavelength dependencies of absorption coefficients of a single-crystal silicon and amorphous silicon.

FIG. 4 shows the wavelength dependency of the light-absorption coefficient of amorphous silicon and that of single-crystal silicon. The axis of abscissa shows the wavelength at a unit of "nm" and the axis of ordinate shows the absorption coefficient at a unit of "×10⁷ cm⁻¹". In this Figure, solid black circles show absorption coefficients of the single-crystal silicon, while white circles show those of the amorphous silicon.

It will be seen that the absorption coefficient of the amorphous silicon exceeds that of the single-crystal silicon at wavelengths of 340 nm or greater. By using the light rays of wavelengths at which the amorphous silicon exhibits greater absorption coefficient than the single-crystal silicon, it is possible to preferentially heat the amorphous layer formed in the surfacial region of the silicon wafer. Suppression of the heating of the single-crystal region serves to retard diffusion of the impurity throughout the single-crystal region, thus making it easier to form shallower junctions.

It is also noted that amorphous silicon exhibits smaller absorption coefficients at wavelengths of 400 nm or greater (visible and infrared wavelength region) than at ultraviolet wavelength region. This means that light rays of wavelengths not smaller than 400 nm are more liable to penetrate deeper into the amorphous silicon region. Use of a laser beam of an ultraviolet wavelength region causes only very shallow surfacial region of the wafer to be heated, and deeper region is indirectly heated as a result of heat conduction from the very shallow surfacial region. In contrast, a laser beam of a wavelength not smaller than 400 nm allows the deeper region to be directly heated by the energy of the laser beam, making it possible to achieve more uniform depthwise temperature distribution, which in turn serves to achieve more uniform distribution of the impurity activation distribution in the depthwise direction.

The absorption coefficient is impractically small at excessively large wavelength of the laser beam, hampering efficient heating. Therefore, the wavelength of the laser beam used for annealing the silicon wafer is preferably selected to fall within the range of from 400 nm to 650 nm.

It is now found that, when the thickness of the amorphous layer is set to 5 nm, the sheet resistance is increased over that of the embodiment which sets the thickness to 20 nm, as will be realized from white circles in FIG. 2. It is also found that the amorphous layer thickness of 5 nm allows boron to be diffused into deeper region than in the embodiment in which the amorphous layer thickness is set to 20 nm. It is understood that a too small thickness of the amorphous layer allows the energy to reach the single-crystal wafer without being sufficiently absorbed by the amorphous layer, with the result that the single-crystal wafer absorbs greater energy.

In order that the laser beam is efficiently absorbed in shallower region, the thickness of the amorphous layer is preferably selected to be greater than 5 nm but not greater than 30 nm.

In the described embodiment, the surfacial region is rendered amorphous down to the depth of 20 nm from the surface by argon ion implantation. This, however, is only illustrative and the amorphization may be effected by other another element which does not affect electrical characteristics of silicon, e.g., germanium. Amorphization also may be effected by a method other than ion implantation, e.g., by plasma doping. Plasma doping is effective particularly when only an ultra-shallow region of 5 nm to 10 nm is to be amorphized.

Figure 5:
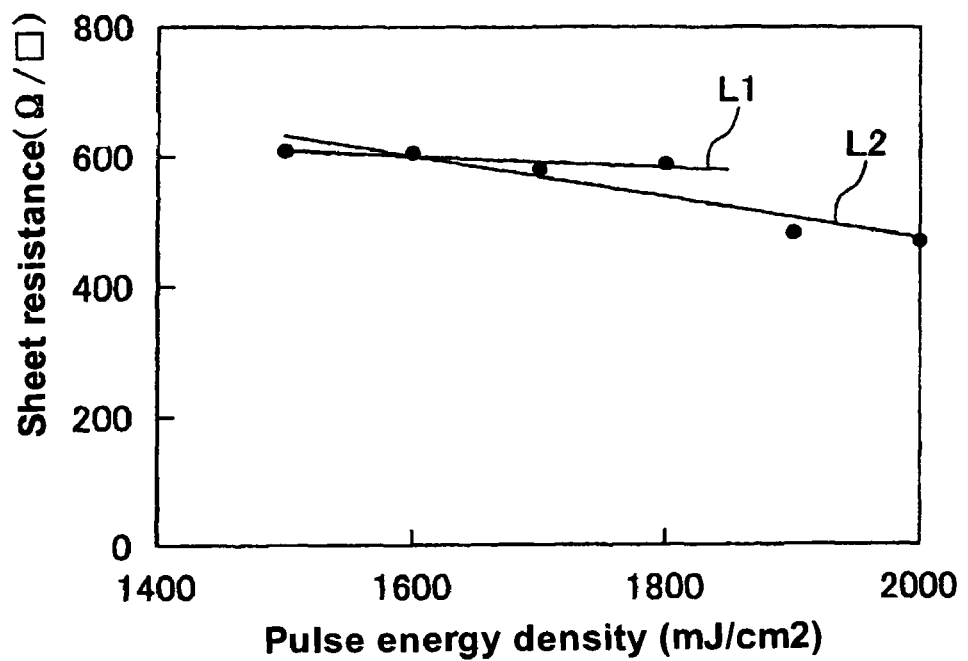
FIG. 5 is a graph showing the relationship between sheet resistance and pulse energy density of a laser beam used in the laser annealing.

FIG. 5 shows the relationship between pulse energy density and sheet resistance observed with specimens prepared by the method embodying the present invention. The axis of abscissa represents the pulse energy density at a unit of "mJ/cm²", while the axis of ordinate shows the sheet resistance at a unit of "Ω/□". More specifically, FIG. 5 shows a portion of the graph of FIG. 2 corresponding to the pulse energy density range between 1500 mJ/cm² and 2000 mJ/cm². It will be seen that the amount of variation of the sheet resistance caused by variation of the pulse energy density is small when the pulse energy density falls within this range.

It is considered that the sheet resistance values as measured are approximated by a straight line L2 when the pulse energy density ranges from 1500 mJ/cm² to 2000 mJ/cm². The amount of variation of pulse energy density is represented here by ΔE and the amount of variation of the sheet resistance is expressed as ΔRs. The value ΔRs is about 150 Ω/□ when the value ΔE is 300 mJ/cm². Taking the pulse energy density level of 1500 mJ/cm² as the basis, the variation of the sheet resistance is estimated to amount to 0.75% in response to 1% variation of the pulse energy density.

The above-described embodiment employs a solid-state laser incorporating a semiconductor laser diode as the pumping light source. This type of laser oscillator has a high energetic stability. The amount of fluctuation of pulse energy is as small as ±1% or less. Therefore, the amount of variation of the sheet resistance can be maintained as small as 0.75% or less, when the laser annealing is conducted at a pulse energy density ranging from 1500 mJ/cm² to 2000 mJ/cm².

The sheet resistance values as measured are approximated by a straight line L1 when the pulse energy density ranges from 1500 mJ/cm² to 1800 mJ/cm². The absolute value of the gradient of the line L1 is smaller than that of the line L2. When the laser annealing is conducted at a pulse energy density ranging from 1500 mJ/cm² to 1800 mJ/cm², the variation of the sheet resistance in response to 1% variation of the pulse energy density may be estimated to be as small as ±0.3%.

Based on the foregoing discussion, it is understood that the pulse energy density on the specimen surface is preferably set to range from 1500 mJ/cm² to 2000 mJ/cm², more preferably from 1500 mJ/cm² to 1800 mJ/cm².

Figure 6:
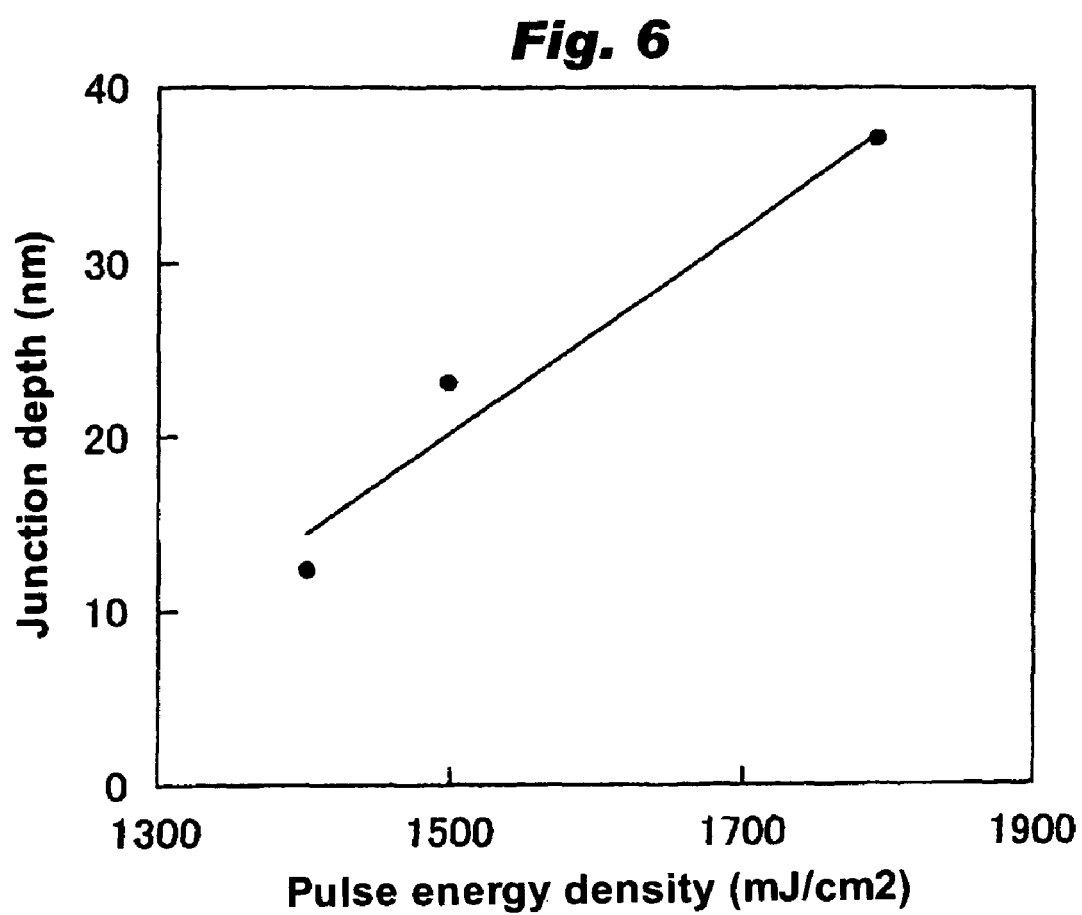
FIG. 6 is a graph showing the relationship between junction depth and pulse energy density of a laser beam used in the laser annealing.

FIG. 6 shows the relationship between pulse energy density and junction depth as observed with specimens produced by the method embodying the present invention. The axis of abscissa represents the pulse energy density at a unit of "mJ/cm²", while the axis of ordinate shows the depth of junction at a unit of "nm". The junction depth increases as the pulse energy density becomes greater. When the pulse energy density falls within the range of from 1400 mJ/cm² to 1800 mJ/cm², a variation of the pulse energy density by 400 mJ/cm² causes the junction depth to vary by about 25 nm. Taking the pulse energy density level of 1500 mJ/cm² as the basis, the variation of the junction depth is 0.93 nm in response to 1% variation of the pulse energy density.

Since the laser light source used in the described embodiment exhibits high energetic stability of ±1% in terms of variation, it is possible to suppress the variation of the junction depth to a small value of ±0.93 nm, When the pulse energy density is set to fall within the range of from 1400 mJ/cm² to 1800 mJ/cm². This amount of variation of the junction depth is small enough to ensure satisfactorily high level of stability in terms of product quality in mass production at an industrial scale.

In the first embodiment of the present invention described heretofore, the silicon wafer was irradiated with a pulse laser beam at the overlap ratio of 50%. In a second embodiment which will now be described, the irradiation with pulse laser beam is conducted at an overlap ratio of 95%. The second embodiment employs a laser annealing apparatus having the same basic arrangement as that shown in FIG. 1. it is to be understood that the stage 44 in the apparatus shown in FIG. 1 is a two-dimensionally movable XY stage.

Figure 7:
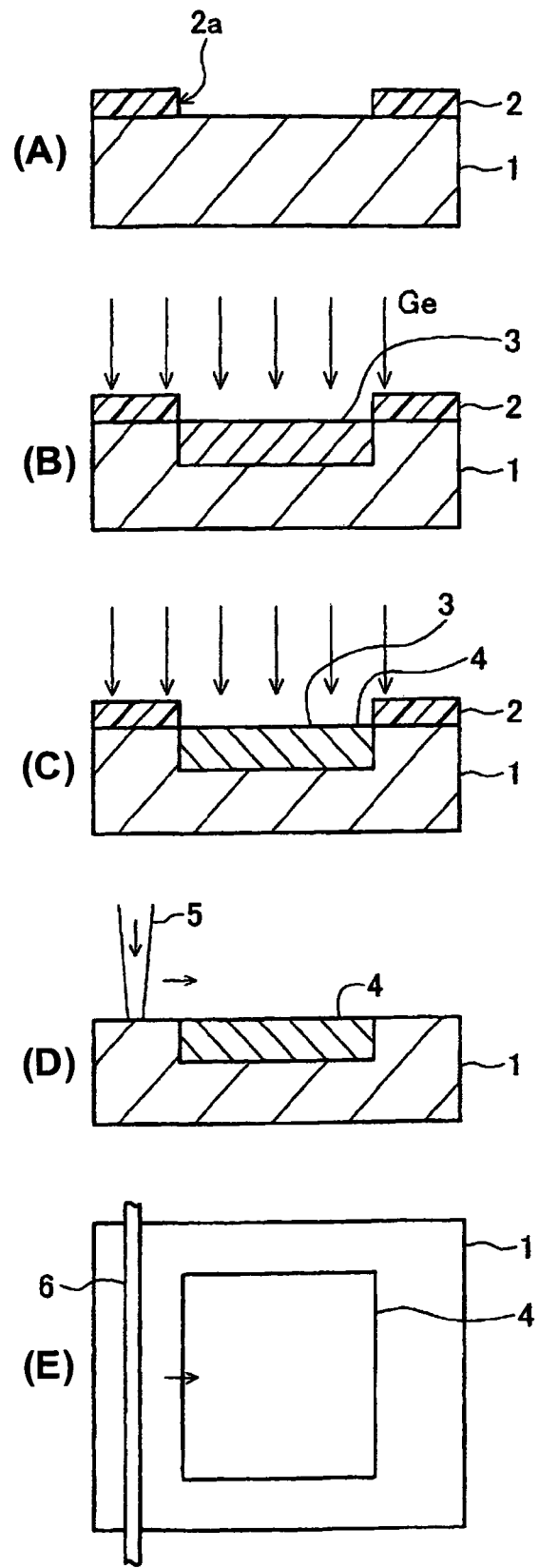
FIG. 7 shows in section and in plan a wafer, for the purpose of illustrating a laser annealing method embodying the present invention.

A laser annealing method in accordance with the second embodiment will be described with reference to FIG. 7.

Referring to FIG. 7(A), a resist film 2 is formed on the surface of an n-type silicon wafer 1 the principal plane of which is the (100) plane. Then, an aperture is formed in the resist film 2 by an exposure/development process.

Then, as shown in FIG. 7(B), argon ions (Ar) are implanted into surfacial region of the silicon wafer 1 through the aperture 2a. The ion implantation is conducted under the same condition as that in the first embodiment. As a result, the portion of the surfacial region under the aperture 2a is amorphized, whereby an amorphous region 3 is formed to have a thickness of about 30 nm. The amorphized region corresponds, for example, to extensions of the source and drain regions of a MOSFET. When it is desired to amorphize extensions of source and drain regions of a MOSFET, argon ions are implanted into the surfacial region of the silicon wafer 1, by using the gate electrode of the MOSFET as a mask.

As shown in FIG. 7(C), boron is injected into the surfacial region of the silicon wafer 1 by plasma doping method while using the resist film 2 as a mask.

As a result, an impurity-doped region 4 is formed. The resist film 2 is then removed.

Referring now to FIG. 7(D), a silicon wafer 1 is held on the stage 44 of the laser annealing apparatus shown in FIG. 1, and a laser beam 5 is made to be incident to the surface of the wafer. The incident laser beam 5 is the second harmonic of Nd:YLF laser, having a wavelength of 527 nm, pulse width of 110 ns, and a pulse frequency of 1 KHz. The wafer was moved in a direction perpendicular to the longer axis of the beam cross-section, in such a manner that the overlap ratio of the beam cross-section on the wafer surface is 50%. The pulse energy density on the surface of the silicon wafer 1 was varied within the range of from 300 mJ/cm² and 3900 mJ/cm². A nitrogen atmosphere was maintained in the processing chamber 40.

As shown in FIG. 7(E), the beam incident region on the wafer surface, i.e., the beam cross-section on the wafer surface, has an elongated linear shape. For instance, the beam incident region 6 has a width of 0.1 mm and a length of 17 mm. The energy density per pulse on the wafer surface ranges from 1400 mJ/cm² to 2000 mJ/cm². The beam incident position is moved stepwise in the direction of the shorter axis of the beam incident region 6 so that the entire surface of the wafer is irradiated with the laser beam 5. The stepwise movement of the laser incident position is performed such that the beam incident region of one shot of the laser beam partially overlaps that of the immediately preceding shot. A term "overlap ratio" is used to mean the value obtained by dividing the area of overlap of the beam cross-section of the instant shot and the region irradiated by the immediately preceding shot by the area of the bream cross-section.

Figure 8:
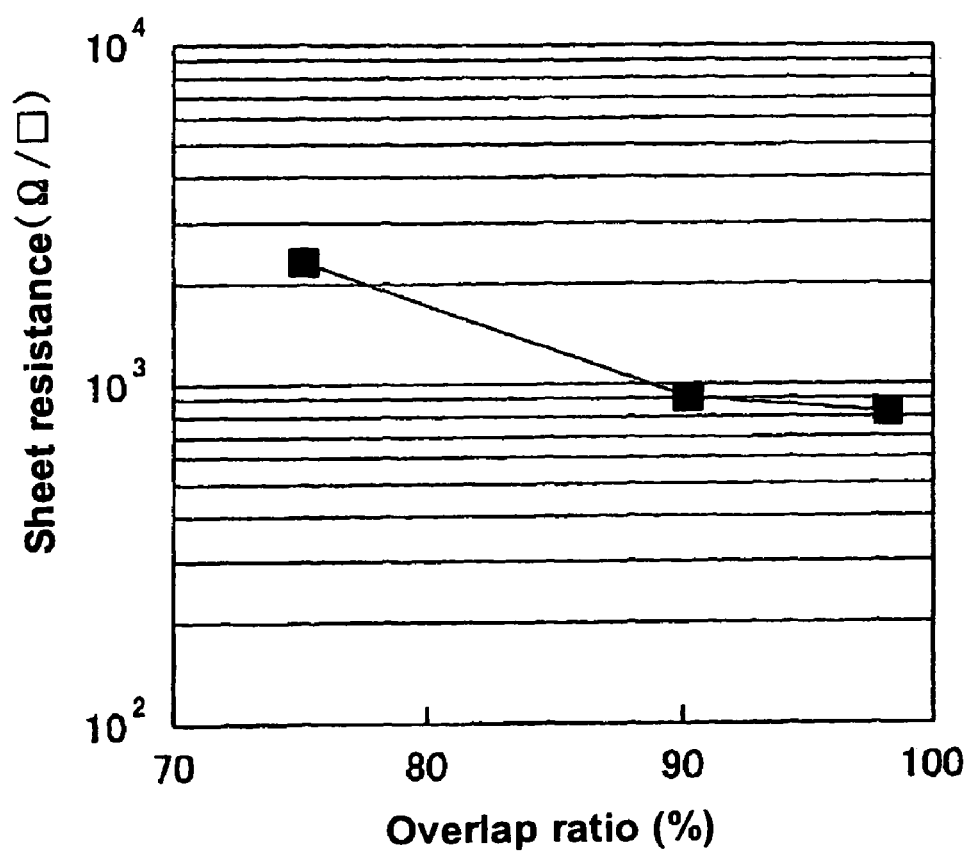
FIG. 8 is a graph showing a relationship between overlap ratio and sheet resistance.
Figure 10:
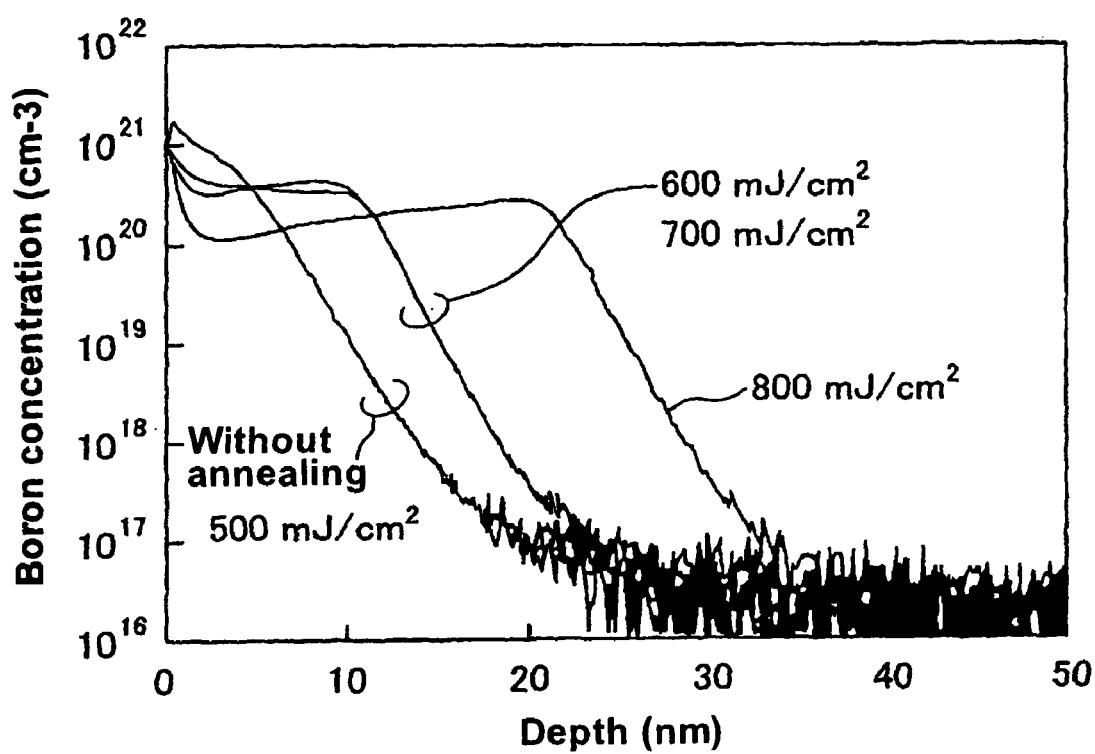
FIG. 10 is a graph showing a boron concentration distribution of a specimen laser-annealed by a known process.
Figure 11:
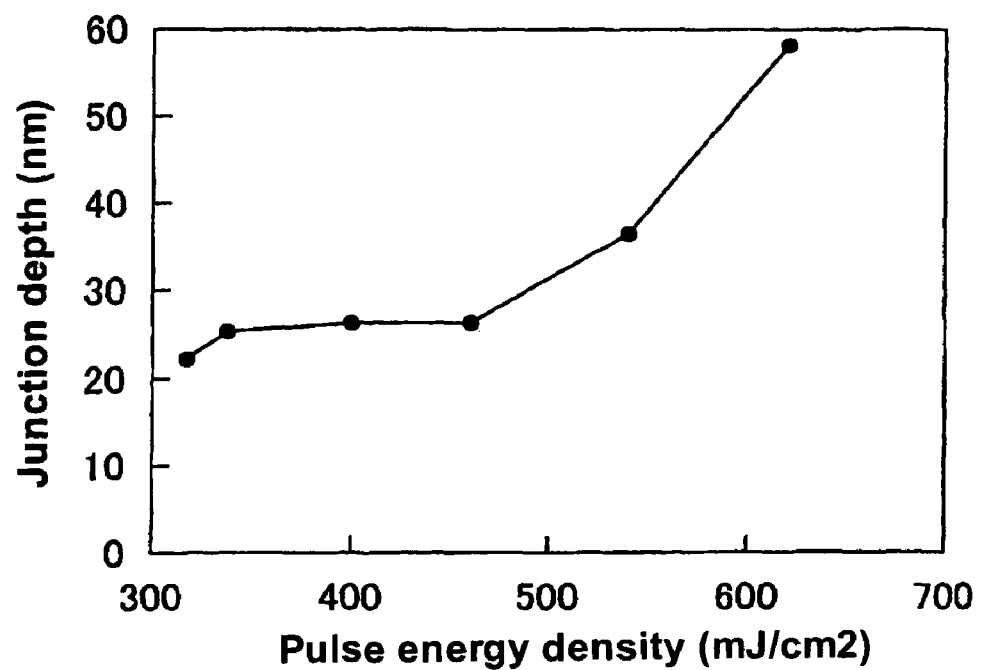
FIG. 11 is a graph showing the relationship between pulse energy density and junction depth of the specimen laser-annealed by the known process.
Figure 12:
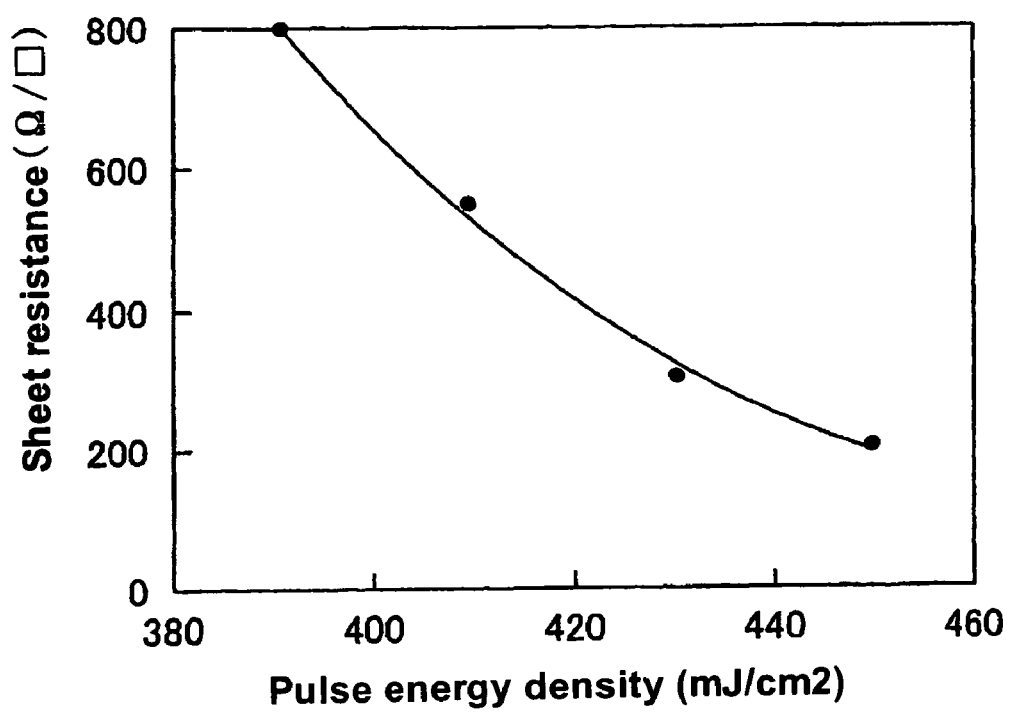
FIG. 12 is a graph showing the relationship between pulse energy density and sheet resistance of the specimen laser-annealed by the known process.

FIG. 8 shows the relationship between the overlap ratio and the sheet resistance. The axis of abscissa shows the overlap ratio at a unit of "%", while the axis of ordinate shows the sheet resistance at a unit of "Ω/□". The data shown in FIG. 8 has been obtained with specimens which were plasma-doped without being subjected to prior amorphization of the surfacial region. The boron dosage was set to $2.5 \times 10^{14}$ cm⁻². The pulse energy density on the specimen surface was set to 1500 mJ/cm².

Increase of the overlap ratio from 75% to 98% causes the sheet resistance to decrease from 2050 Ω/□ to 840 Ω/□. From this fact, it is understood that the sheet resistance is controllable by varying the overlap ratio. The sheet resistance has dependency on both the activation ratio of boron and the depth of junction. This means that at least one of the boron activation ratio and the junction depth is controllable by varying the overlap ratio.

Activation annealing was conducted at a pulse energy density of 1500 mJ/cm², after forming an amorphous layer of 5 nm thick, and the depth of junction was measured. The measured junction depths of about 60 nm and about 90 nm were obtained at the overlap ratios of 75% and 95%, respectively. It is thus possible to adjust the depth of junction by varying the overlap ratio.

FIG. 9(A) is a block diagram of an apparatus for adjusting the positional relationship between the silicon wafer 1 and the beam incident region, as well as relative position therebetween. Scribe lines 10X and 10Y are scribed in a lattice-like pattern on the surface of the silicon wafer 1. The scribe lines 10X extend in the direction of latitude as viewed on the Figure, while the scribe lines 10Y extend in the direction of longitude. The lattice-like scribe lines 10X and 10Y define a plurality of chips 11.

A position sensor 45 senses and detects both translational and rotational positions in the plane of the silicon wafer 1 held on the stage 44. The results of the position detection are input to a control unit 46. The control unit 46 controls the XY stage 44 in such a manner that the longer axis of the beam cross-section 6a extend in parallel with the scribe lines 10Y and that both longitudinal ends of the beam cross-section 6a are positioned on and within two adjacent scribe lines 10X. It is to be noted that the length of the beam cross-section 6a has been adjusted by the homogenizer shown in FIG. 1 so as to be greater than the distance between two adjacent scribe lines 10X but smaller than the sum of the above-mentioned distance and a twofold of the width of each scribe line 10X. The silicon wafer 1 is moved such that both longitudinal ends of the beam cross-section 6a trace on and along the scribe lines 10X, while the pulse laser beam is applied.

The length of the beam cross-section may be set to an integral multiple of the pitch of the scribe lines 10X. For instance, the arrangement may be such that both longitudinal ends of a beam incident region 6b having a length two times as large the pitch of the scribe lines 10X trace on and along the scribe lines 10X.

By setting the length of the beam cross-section on the wafer to a value greater than the pitch of the scribe lines 10X, it is possible to apply the laser beam to the entirety of the chip simply by a unidirectional scanning the chip surface with the laser beam.

In the above-described embodiment, the linear beam incident region moves stepwise in the direction of the shorter axis thereof, such that the areas covered by the successive steps partially overlap each other. It might be possible to use a laser beam which exhibits a square cross-section on the wafer surface, and to effect a control such that the beam incident position is moved in a direction parallel to a pair of opposing sides of the square. In such a case, however, the uniformity of the annealing effect tends to be impaired in the regions near the above-mentioned opposing sides parallel to the direction of the movement. In the described embodiment, both longitudinal ends of the beam incident region 6a and those of the beam incident region 6b trace on and along the scribe lines 10X, portions of the wafer where non-uniformity of the annealing effect appears are exactly on the scribe lines 10X. It is therefore possible to attain a uniform annealing effect over the area of each chip 11.

FIG. 9(B) shows the positional relationship between the intensity distribution along the length of the beam cross-section and the scribe lines 10X. The axis of abscissa indicates the positions along the length of the beam cross-section, while the axis of ordinate shows the intensity level. It will be seen that the intensity gradually decreases in the regions near the longitudinal ends of the beam cross-section, towards the longitudinal end extremities. The region A in which the beam intensity decreases from 90% of the maximum intensity down to 10% of the same will be referred to as "intensity drop-off region". Preferably, the laser beam is applied such that each intensity drop-off regions is positioned within the width of the scribe line 10X. Application of the laser beam in this manner prevents either longitudinal end of the laser beam cross-section from fluctuating into the area of the chip 11, with the result that the non-uniform annealing effect which otherwise is caused by the passage of the longitudinal ends of the beam cross-section.

In the described embodiment, amorphization is effected on the surficial region of the wafer. This, however, is not essential and the amorphization may be effected on an internal layer region of the substrate, i.e., a layer having a predetermined thickness and spaced apart a predetermined depthwise distance from the wafer surface, while maintaining the crystalline state in the surficial region. In this case, the laser beam is preferentially absorbed by the internal amorphous layer, thereby enhancing the activation ratio of this internal layer. Preferably, the laser beam is applied under such a condition that the internal amorphous layer is molten while the surficial crystalline layer remains not molten. This method is effective particularly when a semiconductor structure is desired in which the impurity concentration distribution has a peak in an internal region which is at a predetermined depth from the wafer surface.

In the above-described embodiment, boron implanted in the surficial region of the silicon substrate is activated by laser annealing. The impurity to be implanted, however, is not limited to boron. For instance, impurity such as arsenic (As), phosphor (P), or the like may be implanted and activated. The wafer material to which such impurity is implanted is not limited to silicon. For instance, it is possible to use an SiGe wafer.

The embodiments described heretofore rely upon pulsating oscillation of a solid-state laser which incorporates a semiconductor laser diode as the pumping light source. It is to be understood, however, that the present invention does not exclude the use of continuous oscillation instead of pulsating oscillation. When the laser annealing is effected by a continuously oscillated laser beam, it is possible to activate the impurity effecting such a control that the laser beam incident position moves in the wafer surface, as described before in conjunction with FIG. 7. It is possible to control the junction depth and the activation ratio by controlling the velocity of the movement.

Although the invention has been described in the context of embodiments, it will be appreciated by those skilled in the art that these embodiments are only illustrative and various changes, modifications and improvements may be imparted thereto.

As has been described, in the present invention, a solid-state laser pumped by a semiconductor laser diode is used as the laser light source. This laser effectively serves to reduce fluctuation of the annealing condition, by virtue of its high energy stability. The present invention therefore clears the way to mass production in industrial scale.

The invention claimed is:

1. A method of producing a semiconductor device, the method comprising:
    after amorphizing a surficial region of a wafer of a single-crystal silicon, adding an impurity to the surficial region of the wafer comprising a depth shallower than 100 nm; and
    directly irradiating the amorphized surficial region of said wafer with a pulse laser beam comprising a wavelength not smaller than 400 nm but not greater than 650 nm emitted from a laser-diode-pumped solid-state laser, such that a pulse energy density on a wafer surface is greater than 1500 mJ/cm$^2$ and smaller than 1800 mJ/cm$^2$, thereby activating said impurity.

2. The method of producing a semiconductor device according to claim 1, wherein the amorphizing is conducted such that the amorphized region has a thickness greater than 5 nm but not greater than 30 nm.

3. The method of producing a semiconductor device according to claim 1, wherein a laser medium of said solid-state laser is a medium selected from one of Nd:YLF, Nd:YAG, Nd:YVO$_4$, or Cr:Nd:GSGG.

4. The method of producing a semiconductor device according to claim 1, wherein the irradiating further comprises emitting a pulse laser beam such that the pulse energy density on the wafer surface is not smaller than 1400 mJ/cm$^2$ but not greater than 1800 mJ/cm$^2$.

5. The method of producing a semiconductor device according to claim 1, wherein the irradiating is executed such that the temperature of the surficial region of said wafer is not lower than the melting point of silicon.

6. The method of producing a semiconductor device according to claim 1, wherein in the irradiating is conducted in an inert gas atmosphere.

7. The method of producing a semiconductor device according to claim 6, wherein the inert gas comprises at least one of nitrogen gas, helium gas, and argon gas.

8. A method of producing a semiconductor device, the method comprising:
 adding an impurity to a surficial region of a wafer of a single-crystal silicon comprising a depth shallower than 100 nm; and
 directly irradiating an amorphized surficial region of said wafer with a pulse laser beam emitted from a laser-diode-pumped solid-state laser or with a higher harmonic of said pulse laser beam under a condition that a pulse energy density on the wafer surface is greater than 1500 mJ/cm$^2$ and smaller than 1800 mJ/cm$^2$, thereby activating said impurity.

9. A method of producing a semiconductor device, the method comprising:
 adding an impurity to a surficial region of a semiconductor wafer comprising a depth shallower than 100 nm; and
 directly irradiating an amorphized surficial region of said wafer with a pulse laser beam emitted from a laser-diode-pumped solid-state laser or with a higher harmonic of said pulse laser beam, such that a pulse energy density on a wafer surface is greater than 1500 mJ/cm$^2$ and smaller than 1800 mJ/cm$^2$, thereby activating said impurity,
 wherein said pulse laser beam is configured to exhibit an elongated beam cross-section on the surface of said wafer, and the beam incident position is configured to move in a direction perpendicular to the longitudinal direction of the beam cross-section, wherein a plurality of scribe lines are defined on the surface of said wafer, and wherein the longitudinal length of the beam cross-section on the wafer surface is not smaller than the distance between adjacent scribe lines.

10. The method of producing a semiconductor device according to claim 9, wherein the irradiating comprises uniformalizing a laser beam intensity on the wafer surface in the longitudinal direction of the beam cross-section or in a direction perpendicular thereto.

11. A method of producing a semiconductor device, the method comprising:
 adding an impurity to a surficial region of a semiconductor wafer comprising a depth shallower than 100 nm; and
 directly irradiating an amorphized surficial region of said wafer with a pulse laser beam emitted from a laser-diode-pumped solid-state laser or with a higher harmonic of said pulse laser beam, such that a pulse energy density on a wafer surface is greater than 1500 mJ/cm$^2$ and smaller than 1800 mJ/cm$^2$, thereby activating said impurity,
 wherein said pulse laser beam is configured to exhibit an elongated beam cross-section on the surface of said wafer, and the beam incident position is configured to move in a direction perpendicular to the longitudinal direction of the beam cross-section,
 wherein a plurality of scribe lines have been scribed on the surface of said wafer, and the irradiation with the pulse laser beam is conducted such that intensity drop-off regions, which exist near both longitudinal ends of the beam cross-section on the wafer surface and in which the beam intensity decreases from 90% of the maximum intensity to 10% of the maximum intensity, are positioned within the widths of the scribe lines.

12. The method of producing a semiconductor device according to claim 11, wherein the irradiating comprises uniformalizing a laser beam intensity on the wafer surface in the longitudinal direction of the beam cross-section or in a direction perpendicular thereto.

13. A method of producing a semiconductor device, the method comprising:
 adding an impurity to a surficial region of a semiconductor wafer comprising a depth shallower than 100 nm;
 subjecting said wafer to dehydrogenation treatment; and
 directly irradiating an amorphized surficial region of said wafer with a pulse laser beam emitted from a laser-diode-pumped solid-state laser or with a higher harmonic of said pulse laser beam, such that a pulse energy density on a wafer surface is greater than 1500 mJ/cm$^2$ and smaller than 1800 mJ/cm$^2$, thereby activating said impurity,
 wherein the subjecting comprises subjecting said wafer to a pulse laser beam comprising a same wavelength as the pulse laser beam of the irradiating the wafer under a condition that a pulse energy density on the wafer surface is not smaller than 500 mJ/cm$^2$ but not greater than 1300 mJ/cm$^2$.

14. The method of producing a semiconductor device according to claim 13, wherein the dehydrogenation treatment comprises at least one of heating of said wafer, irradiating said wafer with a laser beam, and irradiating said wafer with an electromagnetic wave.

* * * * *